(12) United States Patent
Ikuta (10) Patent No.: US 7,991,035 B2
(45) Date of Patent: Aug. 2, 2011

(54) SURFACE EMITTING LASER ARRAY (75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/599,991

(22) PCT Filed: Feb. 24, 2009

(86) PCT No.: PCT/JP2009/053789
§ 371 (c)(1),
(2), (4) Date: Nov. 13, 2009

(87) PCT Pub. No.: WO2009/110394
PCT Pub. Date: Sep. 11, 2009

(65) Prior Publication Data
US 2010/0220763 A1    Sep. 2, 2010

(30) Foreign Application Priority Data
Mar. 5, 2008 (JP) ................................. 2008-054867

(51) Int. Cl.
*H01S 5/00* (2006.01)
(52) U.S. Cl. ................ 372/50.12; 372/50.1; 372/50.124
(58) Field of Classification Search .............. 372/50.124
See application file for complete search history.

(56) References Cited

U.S. PATENT DOCUMENTS

| | | | |
|---|---|---|---|
| 6,320,891 B1 | 11/2001 | Seko | 372/50 |
| 7,031,360 B2 | 4/2006 | Ledentsov et al. | 372/43 |
| 7,499,481 B2 | 3/2009 | Ikuta | 372/50.124 |
| 7,535,946 B2 | 5/2009 | Nagatomo et al. | 372/50.124 |
| 7,876,800 B2 * | 1/2011 | Ikuta | 372/50.124 |
| 2004/0179566 A1 | 9/2004 | El-Bahar | 372/45 |
| 2004/0252741 A1 | 12/2004 | Meyer et al. | 372/67 |
| 2005/0117623 A1 | 6/2005 | Shchukin et al. | 372/97 |

(Continued)

FOREIGN PATENT DOCUMENTS

JP    2000-332351 A    11/2000

(Continued)

OTHER PUBLICATIONS

B. Ben Bakir et al., "Surface-emitting microlaser combining two-dimensional photonic crystal membrane and vertical Bragg mirror," Applied Physics Letters, vol. 88, 081113, Feb. 24, 2006.

(Continued)

*Primary Examiner* — Jessica Stultz
*Assistant Examiner* — Phillip Nguyen
(74) *Attorney, Agent, or Firm* — Fitzpatrick, Cella, Harper & Scinto (57) ABSTRACT

Provided is a surface emitting laser array using a photonic crystal, which allows an active layer to be shared without disconnecting the active layer between the individual surface emitting lasers adjacent to each other, and enables high-density arraying easily. The surface emitting laser array includes: at least two surface emitting lasers formed on a substrate, each having a laminated structure of multiple semiconductor layers including a semiconductor multilayer mirror, an active layer, and a photonic crystal having a refractive index profile in an in-plane direction, the photonic crystal and the semiconductor multilayer mirror in the laminated structure forming a waveguide for guiding light in a resonance mode; and a region without the photonic crystal provided between adjacent surface emitting lasers in the surface emitting laser array, in which the surface emitting lasers have the same semiconductor multilayer mirror and the same active layer.

11 Claims, 11 Drawing Sheets

U.S. PATENT DOCUMENTS

| | | | |
|---|---|---|---|
| 2006/0093008 A1* | 5/2006 | Mochizuki | 372/50.23 |
| 2008/0056321 A1* | 3/2008 | Motomura et al. | 372/45.01 |
| 2008/0107145 A1 | 5/2008 | Hori et al. | 372/99 |
| 2008/0299691 A1* | 12/2008 | Bhat et al. | 438/31 |
| 2009/0034572 A1 | 2/2009 | Ikuta | 372/40.013 |
| 2009/0035884 A1 | 2/2009 | Ikuta | 438/29 |
| 2009/0074026 A1* | 3/2009 | Nagatomo et al. | 372/50.124 |
| 2009/0086786 A1 | 4/2009 | Ikuta | 372/50.12 |
| 2009/0232179 A1 | 9/2009 | Ikuta | 372/50.124 |
| 2009/0262775 A1 | 10/2009 | Uchida et al. | 372/50.124 |
| 2010/0014548 A1 | 1/2010 | Ikuta | 372/45.01 |
| 2010/0172390 A1* | 7/2010 | Matsubara et al. | 372/50.12 |

FOREIGN PATENT DOCUMENTS

| | | |
|---|---|---|
| JP | 2003-273456 A | 9/2003 |
| WO | WO 2007/119761 A2 | 10/2007 |

OTHER PUBLICATIONS

N.N. Ledentsov et al., "Novel concepts for injection lasers," Optical Engineering, vol. 41, No. 12, pp. 3193-3203, Dec. 2002.

H.T. Hattori et al., "Analysis of hybrid photonic crystal vertical cavity surface emitting lasers," Optics Express, vol. 11, No. 15, pp. 1799-1808, Jul. 28, 2003.

N.N. Ledentsov et al., "Unique Properties of Quantum Dot Lasers," Nanotechnology, 2003, IEEE-Nano, Third IEEE Conference on Nanotechnology, pp. 360-363.

* cited by examiner

SURFACE EMITTING LASER ARRAY

TECHNICAL FIELD

The present invention relates to a surface emitting laser array using a photonic crystal. For example, the present invention relates to a surface emitting laser array that can also be used as a light source for conducting drawing on a photosensitive drum of an image forming apparatus such as a copying machine or a laser printer.

BACKGROUND ART

Recently, a surface emitting laser for emitting laser light perpendicularly to a substrate has been studied extensively because the surface emitting laser can be advantageously arrayed two-dimensionally, compared with an edge emitting laser.

Further, recently, a surface emitting laser using a photonic crystal has been studied.

As such a surface emitting laser using a photonic crystal, Japanese Patent Application Laid-Open No. 2000-332351 describes a configuration in which an active layer is sandwiched between cladding layers having a refractive index lower than that of the active layer and a photonic crystal having a refractive index profile is formed in an in-plane direction in the cladding layers.

In the surface emitting laser, light guided in the in-plane direction in the active layer resonates in a plane due to the second-order diffraction function of the photonic crystal, and laser light is taken out in a perpendicular direction by the first-order diffraction of the photonic crystal.

Further, Japanese Patent Application Laid-Open No. 2003-273456 discloses a two-dimensional photonic crystal surface emitting laser in which a reflector and a reflector structure with a period of about a half are provided in the periphery horizontal to the crystal plane of the photonic crystal to suppress the loss of light in the horizontal direction, whereby the use efficiency of light is enhanced.

When the surface emitting laser using a photonic crystal, which is disclosed in Japanese Patent Application Laid-Open No. 2000-332351, is arrayed, in particular, in the case of high-density arraying (for example, an array pitch is 100 μm or less) to be desired industrially, the following problem arises.

More specifically, in the case where surface emitting lasers adjacent to each other, which form the surface emitting laser array, are connected through the active layer, the waveguide mode in one surface emitting laser is guided to the other surface emitting laser through the active layer. As a result, for example, the characteristics of the other surface emitting laser are degraded by such light guiding.

Hereinafter, the above-mentioned problem is described more specifically with reference to the drawings.

Figure 2:
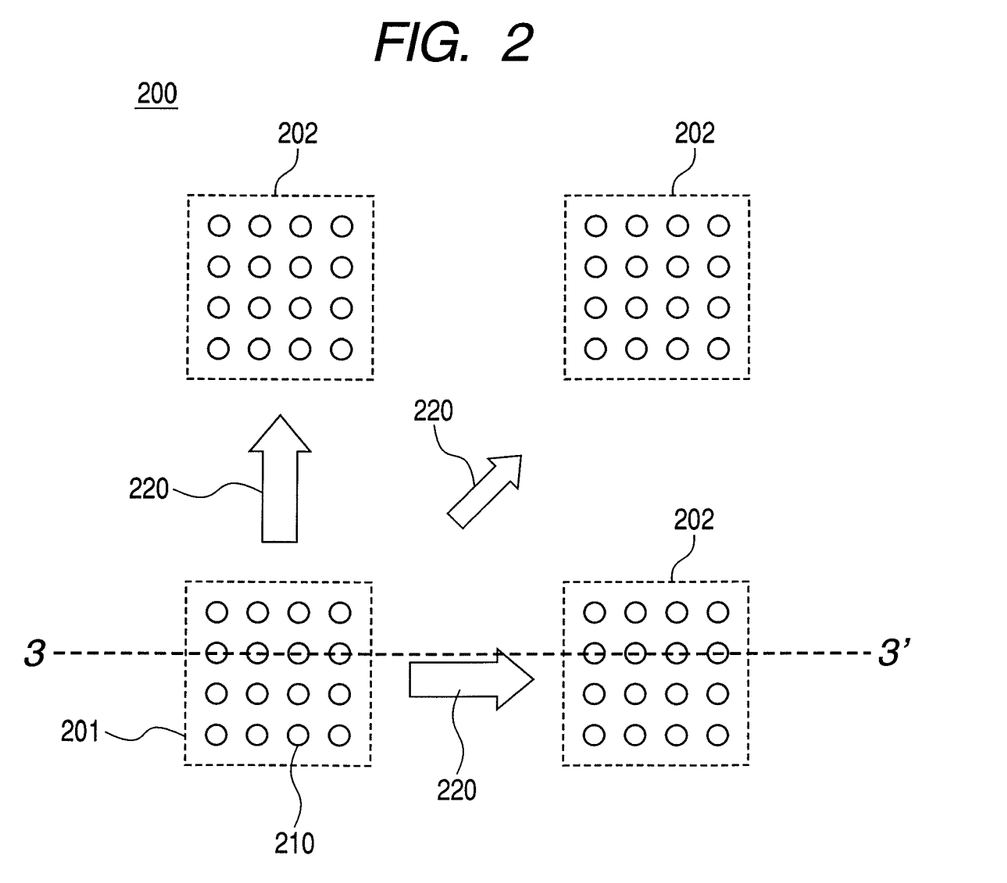
FIG. 2 is a schematic plan view illustrating a surface emitting laser array of Japanese Patent Application Laid-Open No. 2000-332351 that is a known art.

FIG. 2 is a schematic view of a surface emitting laser array 200 obtained by arraying a surface emitting laser using a photonic crystal, which is disclosed in Japanese Patent Application Laid-Open No. 2000-332351, which is viewed from a direction perpendicular to a substrate.

The laser light from a surface emitting laser 201 that resonates in a plane by a photonic crystal 210 is partially guided in the active layer to leak out of a region of the photonic crystal. Consequently, leaking light 220 reaches the active layer of another surface emitting laser 202 to influence the characteristics of another surface emitting laser.

More specifically, in the case where the laser oscillation wavelengths are the same between those surface emitting lasers, resonators may interfere with each other.

Further, even in the case where the oscillation wavelengths are different from each other, if the leaking light is absorbed by the active layer of another surface emitting laser, the leaking light influences the carrier distribution and consequently influences the output characteristics of another surface emitting laser (optical crosstalk).

The cause of those problems is further described with reference to FIG. 3.

Figure 3:
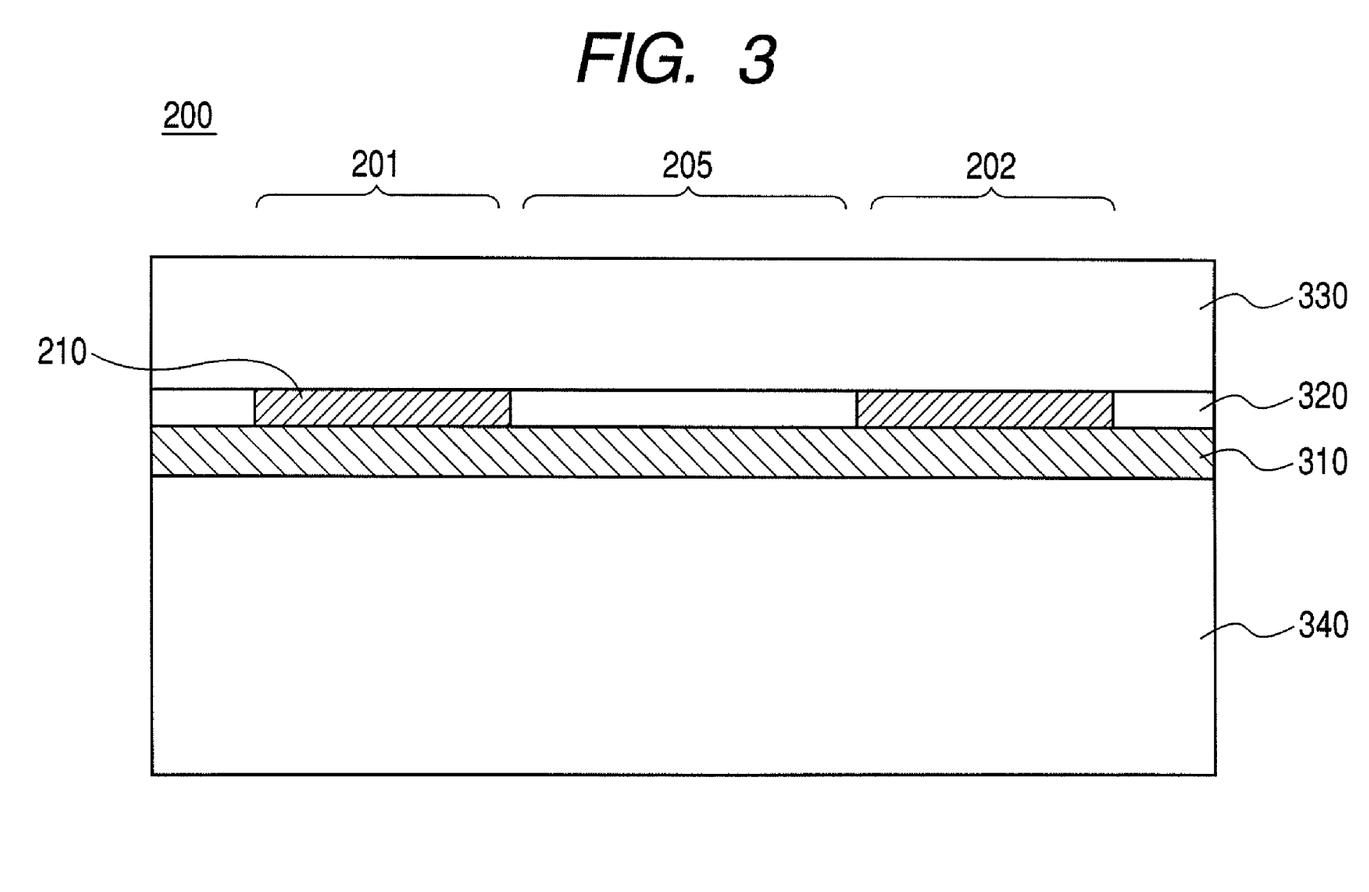
FIG. 3 is a schematic cross-sectional view illustrating the surface emitting laser array of Japanese Patent Application Laid-Open No. 2000-332351 that is the known art.

FIG. 3 is a schematic view illustrating a cross-section of the surface emitting laser array 200 illustrated in FIG. 2, which is taken along a line 3-3' of FIG. 2.

The refractive index of an upper clad (slab layer 320 and cladding layer 330) and a lower cladding layer 340 sandwiching the active layer is lower than that of the active layer.

Therefore, there is a resonance mode that is guided in the active layer due to a total refection in a photonic crystal region 210 (i.e., region of the surface emitting laser 201).

Herein, an active layer 310 illustrated in FIG. 3 includes an active medium such as a quantum well and a spacer layer that adjusts the position of the active medium and the light intensity distribution of the resonance mode.

In the slab layer 320 of the upper clad, the photonic crystal 210 is formed.

The cladding layer 330 of the upper clad may be air.

Herein, even in a region 205 outside the surface emitting laser, the active layer 310 is sandwiched between clads with a low refractive index, and hence there is a waveguide mode at the resonance wavelength of the surface emitting laser 201.

When light intensity distributions of the respective waveguide modes overlap each other inside and outside the region of the surface emitting laser, the laser light resonating in the surface emitting laser 201 is guided to the region 205 outside the surface emitting laser, and further reaches the active layer in another surface emitting laser 202.

As a result, the laser light may influence the characteristics of another surface emitting laser as described above.

Thus, it is necessary to break the connection between the surface emitting lasers adjacent to each other, which form the surface emitting laser array, through the active layer, thereby suppressing light in a waveguide mode of one surface emitting laser from being guided to another surface emitting laser.

In the case of disconnecting the active layer between the surface emitting lasers adjacent to each other for this reason, such a disconnection becomes an obstacle for integrated high-density arraying, and a crystal defect may occur from the disconnected surfaces. This may also lead to the increase in the number of process steps.

Further, when the active layer is disconnected, if the disconnected width between the surface emitting lasers adjacent to each other is small, it is difficult to stop the guiding of light to another surface emitting laser.

In such a case, it is considered to apply the configuration of Japanese Patent Application Laid-Open No. 2003-273456 between the surface emitting lasers adjacent to each other. This is because, it is considered that, the suppression of a loss of light in the horizontal direction of a laser element also leads to the suppression of guided light to another element simultaneously.

However, the application of the configuration of Japanese Patent Application Laid-Open No. 2003-273456 leads to the following problem.

That is, for arraying laser elements, a reflector structure is provided between the surface emitting lasers adjacent to each other, but the provision of such a reflector structure hinders high-density arraying.

The above-mentioned problem is described specifically with reference to the drawings.

Figure 4:
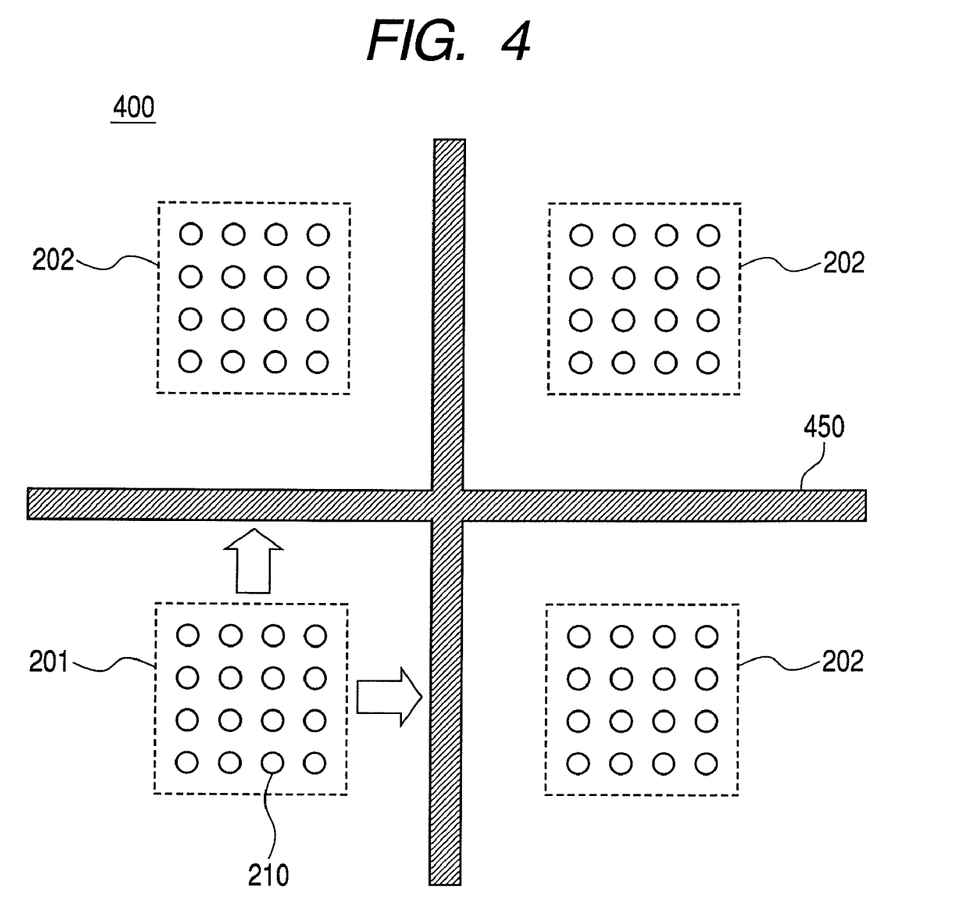
FIG. 4 is a schematic plan view illustrating a surface emitting laser array of Japanese Patent Application Laid-Open No. 2003-273456 that is a known art.

FIG. 4 is a schematic view in which a reflector structure 450 is provided at a position for surrounding the surface emitting lasers 201 and 202.

Figure 5:
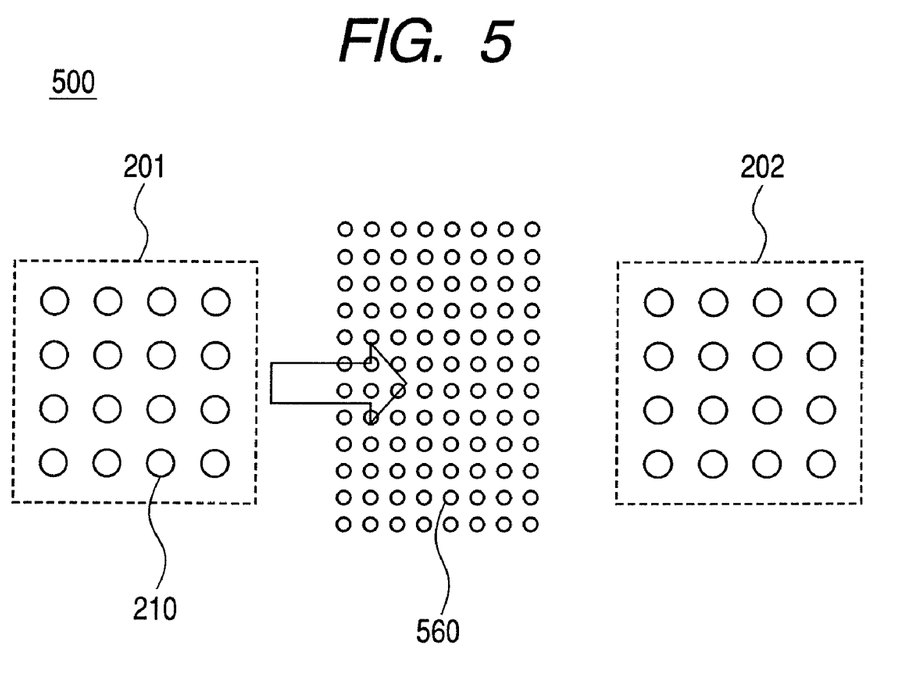
FIG. 5 is a schematic plan view illustrating the surface emitting laser array of Japanese Patent Application Laid-Open No. 2003-273456 that is the known art.

Further, FIG. 5 is a schematic view in which a photonic crystal structure (560 of FIG. 5) having a reflection function (having a photonic band gap) in a horizontal direction is provided as a reflector.

In the case where the reflector structure 450 is provided in the surface emitting laser array 400 arrayed as illustrated in FIG. 4, the provision of the reflector structure 450 hinders high-density arraying. In particular, when the reflector structure 450 is provided, it is difficult to suppress the transmission of light from a laser element to another laser element without disconnecting the active layer that is a waveguide.

Further, the disconnection of the active layer causes the above-mentioned problems.

Further, as illustrated in FIG. 5, in the case where a photonic crystal structure 560 is provided as a reflector in a surface emitting laser array 500 that is arrayed, it is necessary that the photonic crystal structure 560 have a frequency to some degree, in order to allow the photonic crystal structure 560 to function sufficiently as the reflector.

For this reason, it is necessary to set a wider place for the reflector, which is considered to hinder higher-density arraying.

In the case where the cladding layer 330 is air, wiring for electrically driving each surface emitting laser can be placed in the vicinity of the photonic crystal 210.

However, if the reflector structure as described above is provided, compared with the case where there is no reflector structure between elements and the surface of the slab layer 320 is flat, it is more difficult to install electric wiring necessary in the case of electrically driving each laser element of the surface emitting laser array. Thus, also in this respect, high-density arraying may be become difficult.

DISCLOSURE OF THE INVENTION

In view of the above problem, an object of the present invention is to provide a surface emitting laser array using a photonic crystal, allowing an active layer to be shared without disconnecting the active layer between the individual surface emitting lasers adjacent to each other, and enabling high-density arraying easily.

In one embodiment of the present invention, a surface emitting laser array comprises:

at least two surface emitting lasers formed on a substrate, each having a laminated structure of multiple semiconductor layers including a semiconductor multilayer mirror, an active layer, and a photonic crystal having a refractive index profile in an in-plane direction, the photonic crystal and the semiconductor multilayer mirror in the laminated structure forming a waveguide for guiding light in a resonance mode; and a region without the photonic crystal provided between adjacent surface emitting lasers in the surface emitting laser array, wherein the adjacent surface emitting lasers have the same semiconductor multilayer mirror and the same active layer.

Further, in another embodiment of the present invention, a surface emitting laser array comprises:

a first surface emitting laser which has a laminated structure of multiple semiconductor layers including a first semiconductor multilayer mirror, a first active layer, and a first photonic crystal having a refractive index profile in an in-plane direction, the first photonic crystal and the first semiconductor multilayer mirror forming a waveguide for guiding light in a resonance mode; and a second surface emitting laser which has a laminated structure of multiple semiconductor layers including the first semiconductor multilayer mirror, the first active layer, and a second photonic crystal that has a refractive index profile in an in-plane direction and is different from the first photonic crystal, the second photonic crystal and the first semiconductor multilayer mirror forming a waveguide for guiding light in the resonance mode.

According to the present invention, a surface emitting laser array using a photonic crystal can be realized, which allows an active layer to be shared without disconnecting the active layer between the individual surface emitting lasers adjacent to each other, and enables high-density arraying easily.

DETAILED DESCRIPTION OF THE EMBODIMENTS

Next, a surface emitting laser array, in which at least two surface emitting lasers are formed on a substrate according to an embodiment of the present invention, is described with reference to the drawings.

Figure 6:
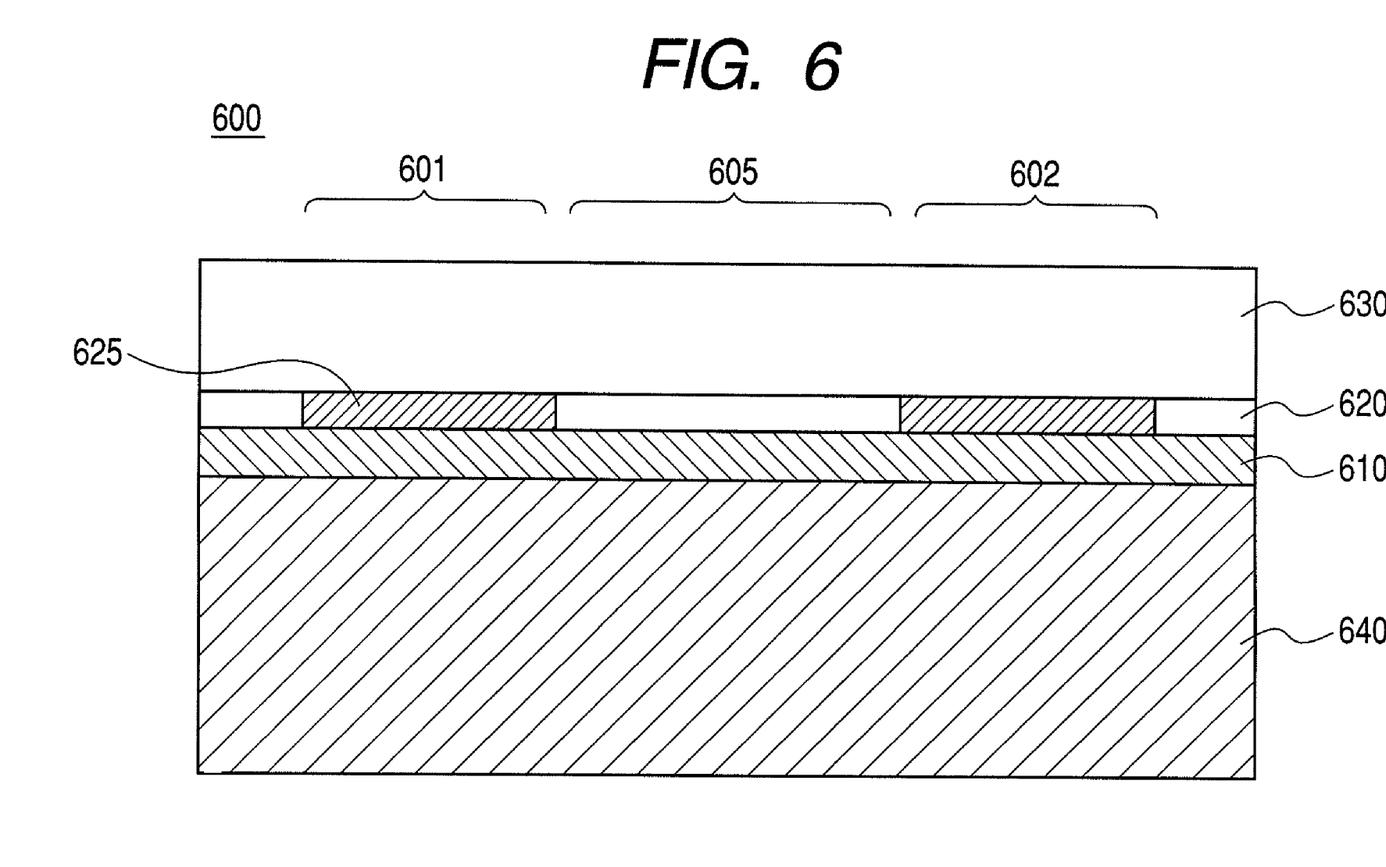
FIG. 6 is a schematic cross-sectional view illustrating a surface emitting laser array according to an embodiment of the present invention.
Figure 7:
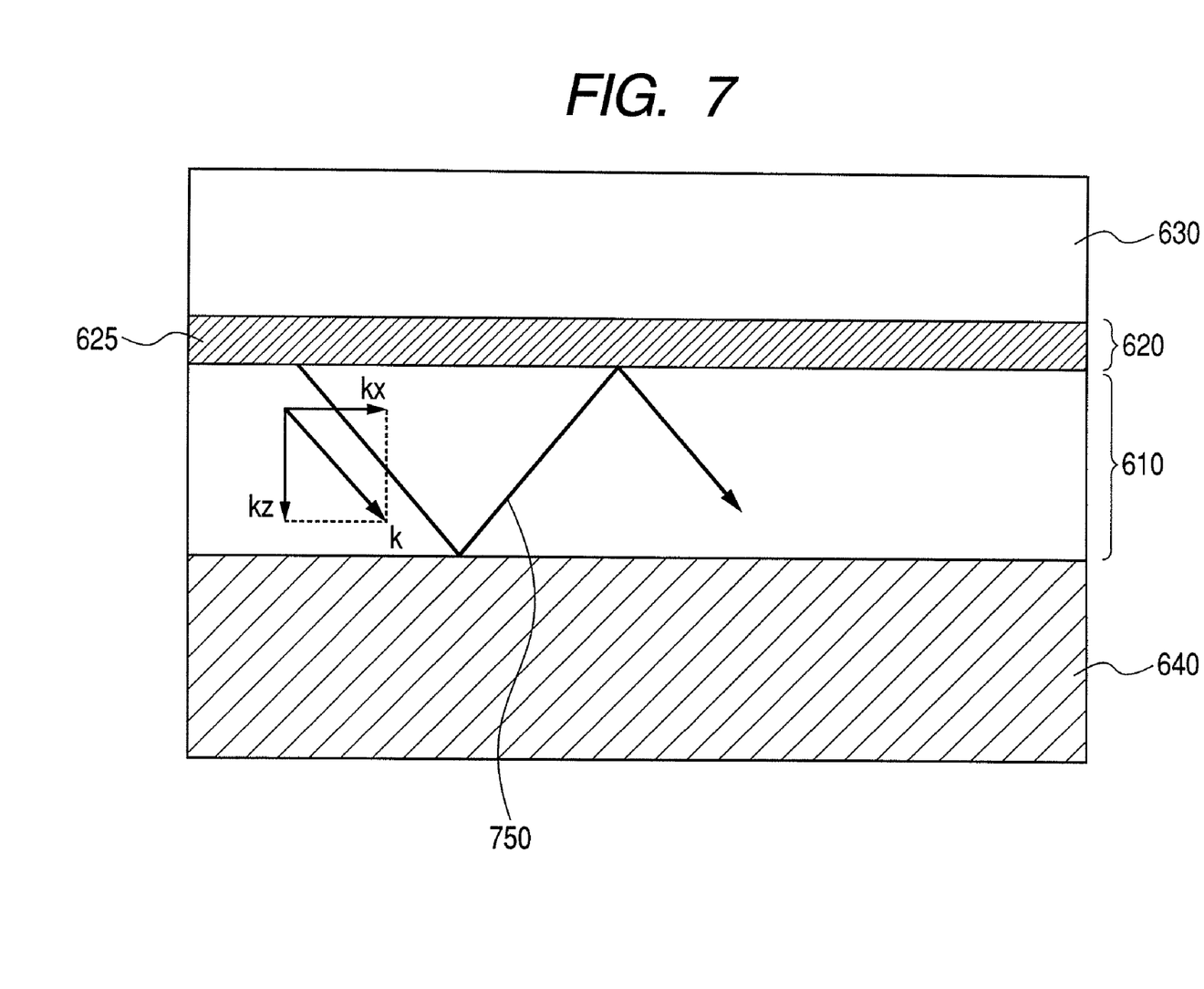
FIG. 7 is a schematic cross-sectional view illustrating a state of light in a resonance mode by ray-approximation, in which a cross-section of a surface emitting laser located in a photonic crystal region of FIG. 6 according to the embodiment of the present invention is enlarged.
Figure 8:
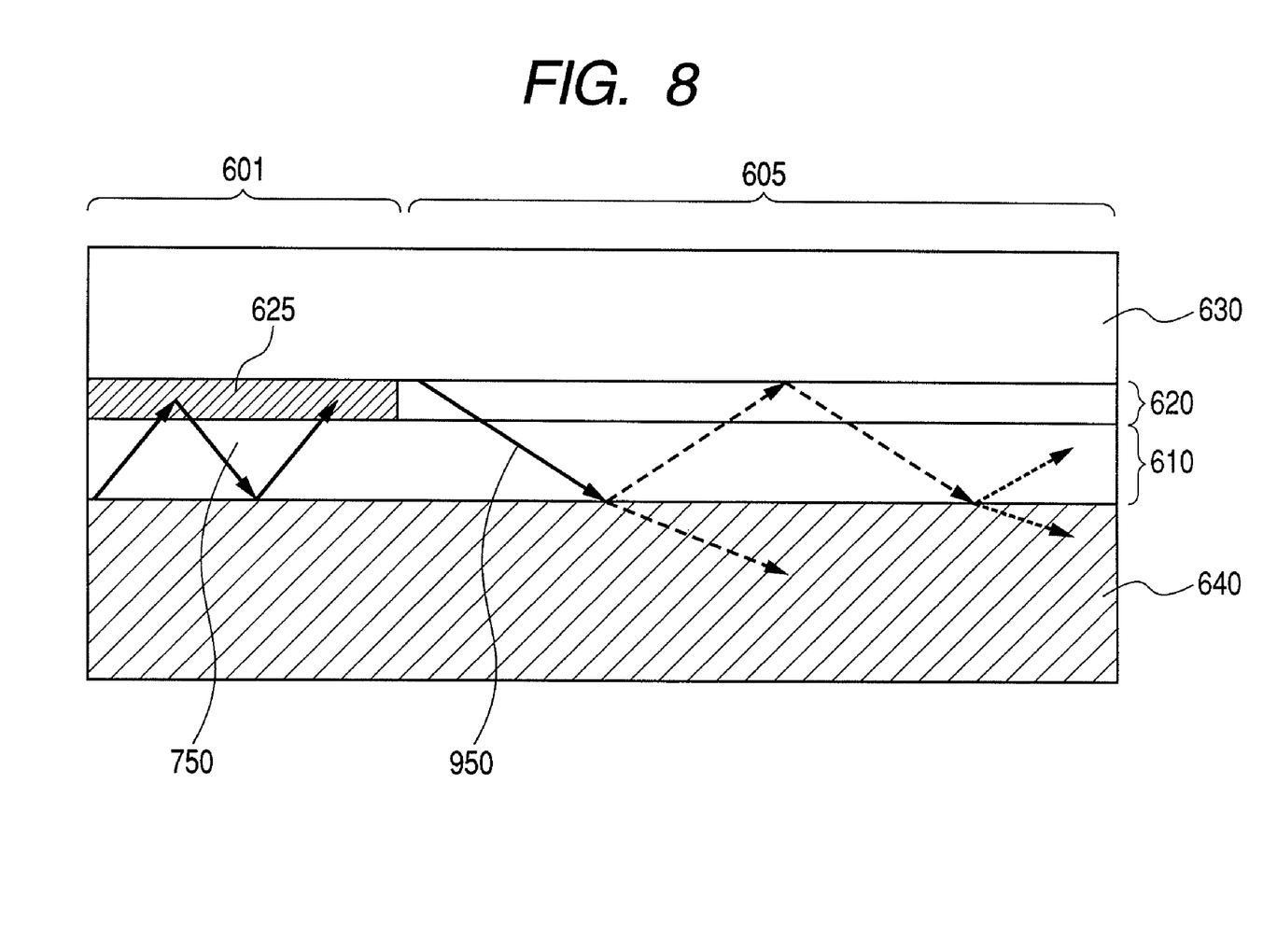
FIG. 8 is a schematic cross-sectional view illustrating a state of light in a resonance mode by ray-approximation, in which a cross-section of the surface emitting laser array located in the photonic crystal region and a photonic crystal peripheral region of FIG. 6 according to the embodiment of the present invention is enlarged.

FIG. 6 is a schematic cross-sectional view for describing a surface emitting array of the present invention. Further, FIG. 7 is a schematic cross-sectional view illustrating a state of light in a resonance mode by ray-approximation, in which a cross-section of a surface emitting laser located in a photonic crystal region 601 of FIG. 6 is enlarged. Further, FIG. 8 is a schematic cross-sectional view illustrating a state of light in a resonance mode by ray-approximation, in which a cross-section of a surface emitting laser array located in a photonic crystal region 601 and a photonic crystal peripheral region 605 of FIG. 6 is enlarged.

In FIG. 6, a surface emitting laser array 600 includes regions 601 and 602 in which a photonic crystal is formed, a region 605 between surface emitting lasers, and an active layer 610. Further, the surface emitting laser array 600 includes a slab layer 620, a photonic crystal 625, an upper cladding layer 630, and a semiconductor multilayer mirror 640.

In the surface emitting laser array of this embodiment, a surface emitting laser forming the laser array has a laminated structure of multiple semiconductor layers including a semiconductor multilayer mirror, an active layer, and a photonic crystal having a refractive index profile in an in-plane direction. At this time, for those semiconductor layers, semiconductor layers which contain p-doped GaN or AlGaN or InGaN or AlInGaN can be used.

Specifically, as illustrated in FIG. 6, the surface emitting laser array 600 has a configuration in which the semiconductor multilayer mirror 640, the active layer 610, the slab layer 620, and the upper cladding layer 630 are laminated on a substrate (omitted in FIG. 6).

The active layer 610 includes an active medium such as a quantum well and a spacer layer that adjusts the position of the active medium and the light intensity distribution of a resonance mode of each laser resonator.

The slab layer 620 has multiple photonic crystal structures 625 having a periodical refractive index profile in a slab in-plane direction.

Herein, the photonic crystal 625 is formed, for example, in a two-dimensional tetragonal lattice shape. The regions 601 and 602 in which the photonic crystal is formed respectively function as surface emitting lasers.

First, the resonance mode of the surface emitting laser is described with reference to FIG. 7 by ray-approximation.

The surface emitting laser is configured so that a resonance mode in which light resonates in an oblique direction with respect to the lamination direction of the multilayer mirror in a waveguide formed by the photonic crystal and the multilayer mirror is present.

Specifically, an in-plane resonant waveguide is formed as a laser resonator, in which an in-plane resonance function is added to a waveguide mode including the active layer 610 by the photonic crystal 625 and the semiconductor multilayer mirror 640.

Herein, as illustrated in FIG. 7, light 750 that is guided in an xz-plane is considered. X represents a substrate in-plane direction and z represents a substrate perpendicular direction. A z-component and an x-component of a wave vector k of light with a wavelength λ in a resonance state are assumed to be kz and kx, respectively.

Regarding light in a resonance state, the following expression holds from waveguide conditions (a standing wave rises in a z-direction).

$$n \cdot d \cdot k_z + \phi = l\pi \quad (l \text{ is an integer}) \quad (1)$$

Further, the following expression holds from the diffraction conditions with respect to vertical incident light.

$$n \cdot a \cdot k_x = 2m\pi \quad (m \text{ is an integer}) \quad (2)$$

Herein, n represents an effective refractive index of a waveguide, d represents an effective waveguide thickness, a represents a lattice constant of a photonic crystal, and φ represents a phase shift (Goos-Hanchen shift) at a time of reflection. Herein, for simplicity of description, m is set to be 1 and φ is set to be 0.

When λ is assumed to be a laser resonance wavelength and θ is an incident angle to a semiconductor multilayer mirror, $k_z = 2\pi \cos\theta/\lambda$, $k_x = 2\pi \sin\theta/\lambda$.

Herein, when Expressions (1) and (2) are solved with respect to λ and θ, $\lambda = n/\sqrt{((1/a)^2 + (1/2d)^2)}$, $\theta = \arctan(k_x/k_z) = \arctan(2d/la)$. More specifically, the semiconductor multilayer mirror 640 is designed so that a reflectance increases with respect to diffracted light at an incident angle θ incident upon the semiconductor multilayer mirror 640 at a resonance wavelength λ.

At this time, the semiconductor multilayer mirror 640 can be configured so as to have a higher reflectance with respect to light at an incident angle of more than 0° and less than 90° than a reflectance with respect to light at an incident angle of 0°. Alternatively, the semiconductor multilayer mirror 640 can be configured so as to have a high reflectance even with respect to light at any of those incident angles.

The effective waveguide thickness varies between the surface emitting laser regions 601 and 602 in which the photonic crystal 625 is formed and the region 605 between the surface emitting lasers, in which the photonic crystal 625 is not formed.

For example, in the case where the photonic crystal 625 is formed in such a manner that holes filled with a medium (for example, air) with a refractive index lower than that of the slab layer are placed periodically in the slab layer, the effective waveguide thickness of the region 605 is larger than the effective waveguide thickness d of the surface emitting laser region 601.

At this time, according to Expression (1), kz of the propagation mode in the region 605 decreases, and if the wavelength is λ, kx increases accordingly.

This means that an incident angle to the multilayer increases in the region 605 without a photonic crystal.

In a configuration in which a waveguide sandwiched between cladding layers with a lower refractive index is formed, and light is confined by the total reflection in those low-refractive index cladding layers as disclosed in Japanese Patent Application Laid-Open No. 2000-332351 and Japanese Patent Application Laid-Open No. 2003-273456, even if an incident angle to a clad varies, when an incident angle is larger than a critical angle at an interface between the active layer and the low-refractive index cladding layer, there is a waveguide mode.

Therefore, as described in the problems to be solved by the invention, the above-mentioned waveguide mode is guided through the active layer connected between each surface emitting laser, with the result that the characteristics of the surface emitting laser may be degraded.

In contrast, in a configuration in which a resonance mode is present in a waveguide formed of a photonic crystal structure and a multilayer mirror as in this embodiment, light can be suppressed from being guided to the other surface emitting laser.

More specifically, in the confinement structure by a multilayer reflection mirror as in this embodiment, even when an incident angle to a multilayer increases or decreases, a reflectance decreases.

Therefore, a propagation mode 950 in the region 605 without a photonic crystal becomes a leaky mode in which a waveguide loss is extremely large as in FIG. 8.

Thus, in this embodiment, laser light oscillating in the photonic crystal region cannot be guided in the active layer in the region without a photonic crystal. Therefore, the exchange of light between lasers of the surface emitting laser array can be eliminated even without disconnecting the active layer and providing a reflection structure.

Thus, in the surface emitting laser array in this embodiment, the active layer between the surface emitting lasers adjacent to each other which form the surface emitting laser array can be shared without being disconnected.

As described above, in the surface emitting laser array of this embodiment, as a surface emitting laser in the laser array, a surface emitting laser having a configuration in which a resonance mode is guided in a waveguide formed of the photonic crystal structure and the semiconductor multilayer mirror is configured.

At this time, in order that the semiconductor multilayer mirror and the active layer are shared between surface emitting lasers adjacent to each other in the surface emitting laser array, for example, the semiconductor multilayer mirror and the active layer are formed continuously between the lasers.

From the above, a photonic crystal surface emitting laser array that can be easily arrayed at a high density can be realized.

EXAMPLES

Hereinafter, the present invention is described by way of examples.

Example 1

Figure 1:
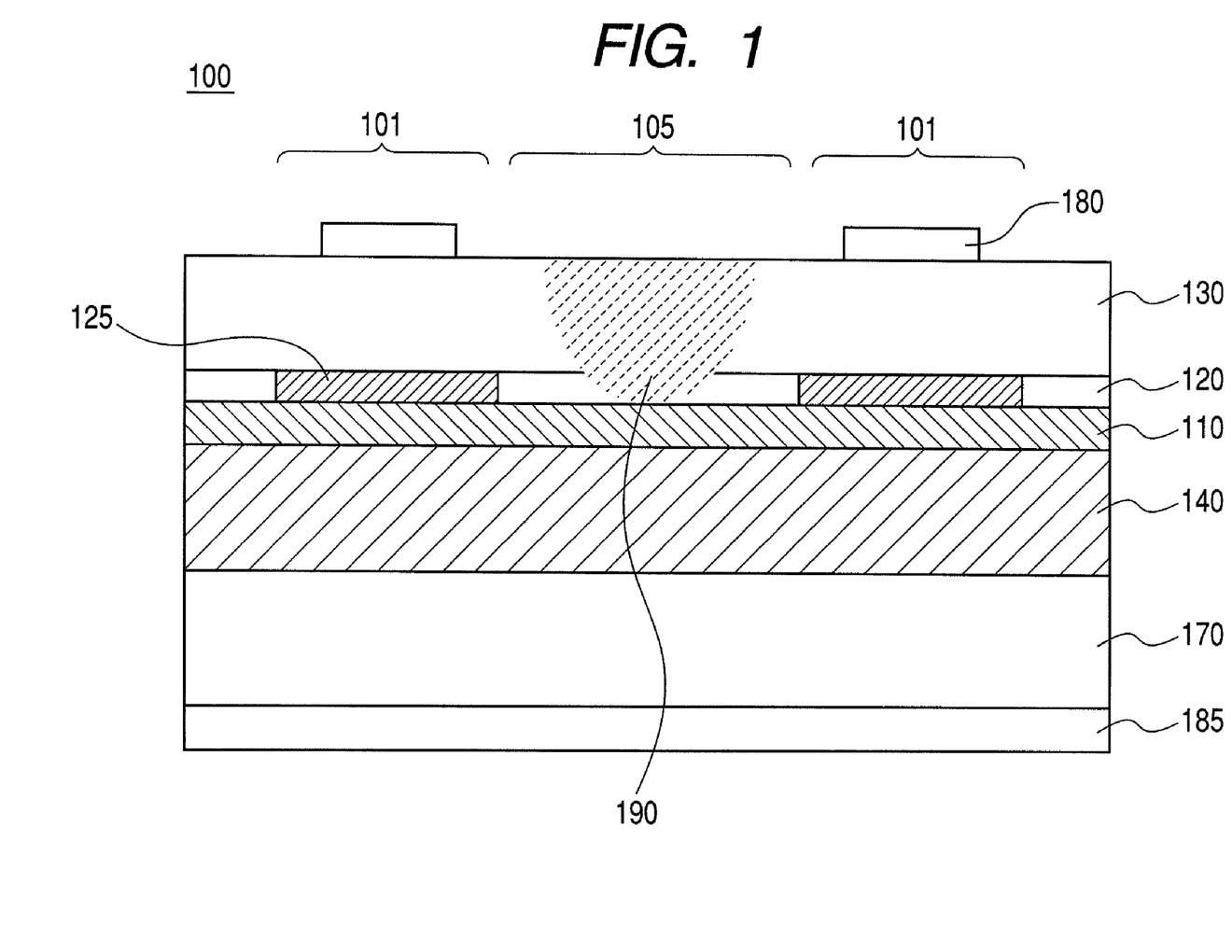
FIG. 1 is a schematic cross-sectional view illustrating a surface emitting laser array according to Example 1 of the present invention.

In Example 1, a surface emitting laser array to which the present invention is applied is described. FIG. 1 is a schematic cross-sectional view illustrating a surface emitting laser array of the present example. In FIG. 1, a surface emitting laser array 100 includes a substrate 170, a multilayer mirror 140, an active layer and spacer layer 110, a slab layer 120, a cladding layer 130, an upper electrode 180, and a lower electrode 185. A photonic crystal 125 is formed in the slab layer 120.

A region 190 is electrically insulated.

According to the present example, in the surface emitting laser array 100, multiple surface emitting lasers 101 are provided with a non-laser region 105 interposed therebetween.

A substrate and the multilayer mirror are, for example, n-doped and a slab layer and a cladding layer are, for example, p-doped with the active layer interposed therebetween.

When a voltage is applied between the upper electrode 180 provided for each of the surface emitting lasers 101 and the common lower electrode 185, carriers are injected into the active layer and the active layer emits light.

Sufficient carriers are injected into the active layer in a light resonator in which the wavelength is defined by the photonic crystal and the multilayer mirror, whereby the light resonator oscillates a laser.

The laser light is diffracted in a substrate vertical direction by the photonic crystal structure, and for example, laser light can be taken out from the periphery of the upper electrode as light output.

In the non-laser region 105, a part of the region 190 is electrically insulated. Therefore, the surface emitting laser array 100 can be individually driven electrically.

In the surface emitting laser array 100 of the present example, the active layer located in the non-laser region 105 is formed continuously.

However, laser light of the surface emitting laser 101 is not guided as it is to the active layer of the peripheral surface emitting laser, and thus optical cross-talk between the lasers is extremely small.

Further, the active layer between the lasers is not exposed by an etching process, whereby the increase in crystal defect can be prevented, compared with the case where the active layer is disconnected.

Further, a light reflector structure is not provided between the lasers, whereby the interval between the elements can be set to be small.

Next, a method of manufacturing a surface emitting laser array according to the present example is described.

First, the multilayer mirror 140, the active layer 110 sandwiched between appropriate spacer layers, and the slab layer 120 are grown on the semiconductor substrate 170.

Herein, for example, an n-type GaAs substrate is used as the substrate 170. For example, an MOCVD method or an MBE method can be used as the growth method.

The multilayer mirror has a configuration in which 60 pairs of n-type $Al_{0.5}Ga_{0.5}As/Al_{0.9}Ga_{0.1}As$ are laminated.

The multilayer mirror is combined with the photonic crystal structure 125 described later to function as a resonator.

The surface emitting laser array is designed so that the reflectance of the multilayer mirror at a laser oscillation wavelength (herein, about 670 nm) is the highest with respect to a direction (for example, 45° with respect to the lamination direction) in which the light at the above-mentioned wavelength is diffracted when being incident perpendicularly to the photonic crystal structure 125.

Next, a method of forming such a multilayer mirror is described.

The multilayer mirror has a configuration in which high refractive index layers and low refractive index layers are laminated alternately, and each layer thickness may be $\lambda/4 \cdot ni \cdot \cos \theta i$.

Herein, $\lambda$ represents a laser resonance wavelength, $ni$ represents a refractive index of each layer, and $\theta i$ represents an angle formed by the traveling direction of diffracted light and the lamination direction of the multilayer mirror in each layer.

The active layer 110 is composed of, for example, an n-type $Al_{0.9}Ga_{0.1}As$ spacer layer, a GaInP/AlGaInP multi-quantum well layer, and a p-type $Al_{0.9}Ga_{0.1}As$ spacer layer. It is assumed that the active layer has an optical gain at a wavelength of 670 nm. As the thickness of the spacer layer, a suitable value is selected depending upon desired resonator characteristics. The slab layer 120 is, for example, a p-type $Al_{0.9}Ga_{0.1}As$.

Figure 11:
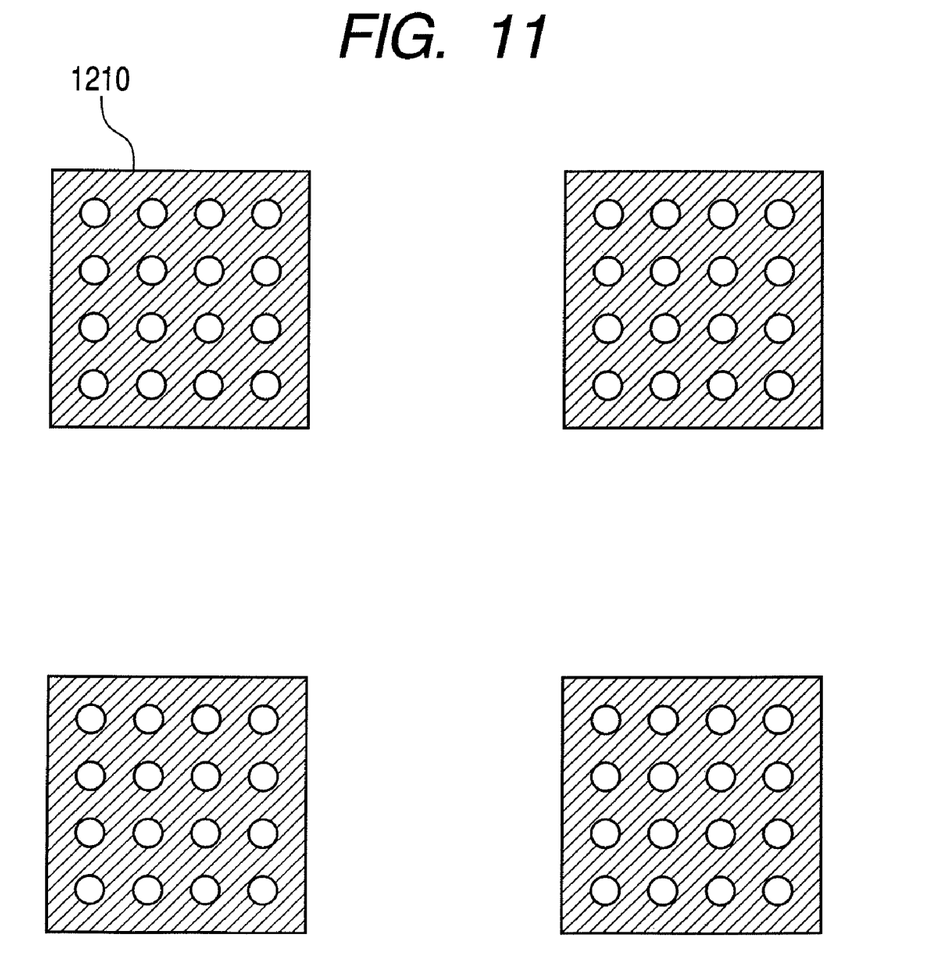
FIG. 11 is a schematic plan view for describing a method of manufacturing the surface emitting laser array according to Example 1 of the present invention.

A resist is applied onto the upper surface of the slab layer 120, and, for example, a two-dimensional tetragonal lattice pattern 1210 with a radius of 90 nm, a lattice interval of 290 nm, and an area of 50 μm per side is formed in an array on the resist as illustrated in FIG. 11.

Further, the array pitch interval is, for example, 100 μm.

Then, after the resist development, multiple photonic crystal structures 125 made of a two-dimensional pillar array are formed in the slab layer 120, using reactive ion etching, for example, with $SiCl_4/Ar$ plasma. After the photonic crystal structures 125 are formed, the resist is removed.

The p-type cladding layer 130 is formed by fusion or re-growth on the slab layer 120. The cladding layer 130 is, for example, made of $Al_{0.9}Ga_{0.1}As$. On the cladding layer 130, a contact layer that improves the electrical contact with electrodes may be laminated.

The contact layer is made of, for example, p-type GaAs with a thickness of 20 nm.

The insulated region 190 for confining a current in the active layer located under the photonic crystal structures 125 is formed.

The insulated region can be formed, for example, by irradiating ions such as protons to decrease the electrical conductivity by ion injection to a part or the whole of a region between the surface emitting lasers.

The electrodes (upper electrodes) 180 for driving the surface emitting lasers individually are provided on the upper surface of the cladding layer, and the common electrode (lower electrode) 185 is provided under the substrate. The electrodes 180 are made of, for example, Ti/Au, and the electrode 185 is made of, for example, AuGe/Au.

When a current is injected into each laser with respect to the surface emitting laser array 100 thus manufactured, the active layer 110 emits light, and surface emission at a wavelength of about 670 nm occurs from each element in the substrate vertical direction due to laser oscillation caused by the above-mentioned resonance principle.

Herein, the electrodes 180 are provided on the cladding layer 130, but the cladding layer 130 may be air. In this case, the electrodes 180 are provided on the slab layer 120. The process of forming the cladding layer 130, such as fusion and re-growth, can be omitted by not providing the cladding layer 130.

Further, in the case where the total thickness of the cladding layer 130 and the slab layer 120 is sufficiently smaller than an array pitch, and the electrical conductivity of the cladding layer and the slab layer is small (for example, in the case of a p-type GaN based material), the respective laser elements can be driven electrically independently even without particularly providing the insulated region 190.

Example 2

In Example 2, an exemplary configuration of a surface emitting laser array to which the present invention is applied is described, in which each laser is driven by optical excitation as a unit for driving the surface emitting laser array.

Figure 9:
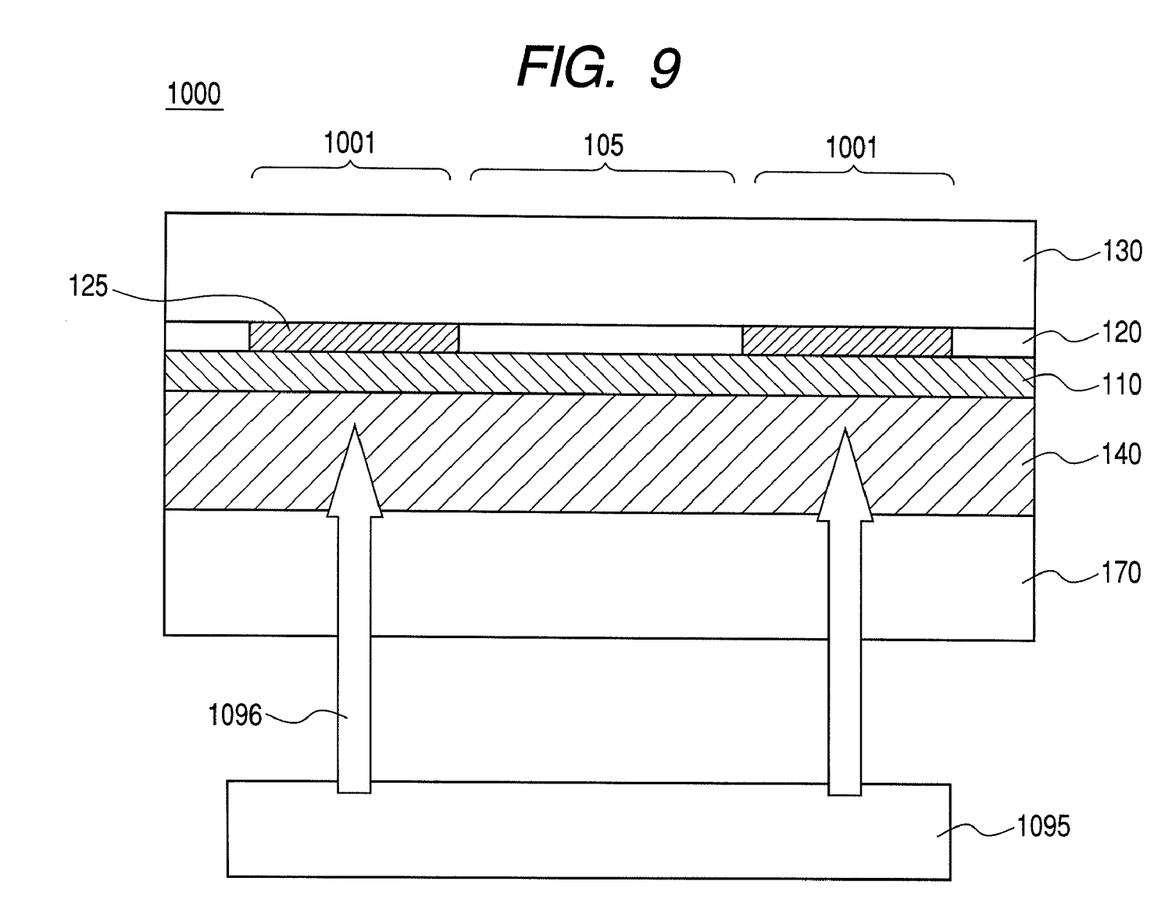
FIG. 9 is a schematic cross-sectional view illustrating a surface emitting laser array according to Example 2 of the present invention.

FIG. 9 is a schematic cross-sectional view for describing an exemplary configuration of the surface emitting laser array of the present example.

In FIG. 9, a surface emitting laser array 1000 includes a surface emitting laser 1001, an excitation source 1095, and excited light 1096.

In the surface emitting laser array 1000 in Example 2, the multilayer mirror 140, the active layer 110, and the slab layer 120 are formed on the substrate 170 in the same way as in Example 1. The photonic crystal 125 is formed on the slab layer 120.

The cladding layer 130 is formed on the slab layer. The cladding layer 130 may be air. The surface emitting laser array 1000 includes the excitation source 1095 capable of causing optical excitation of the active layer of each surface emitting laser individually. The excitation source is, for example, a laser scanner.

Due to the excitation light 1096 from the excitation source 1095, the active layer of each surface emitting laser 1001 is excited to cause laser oscillation, and each laser emits laser light in the substrate vertical direction.

Example 3

In Example 3, an exemplary configuration in which light absorber is provided between the respective surface emitting lasers of the surface emitting laser array of Example 1 is described.

Figure 10:
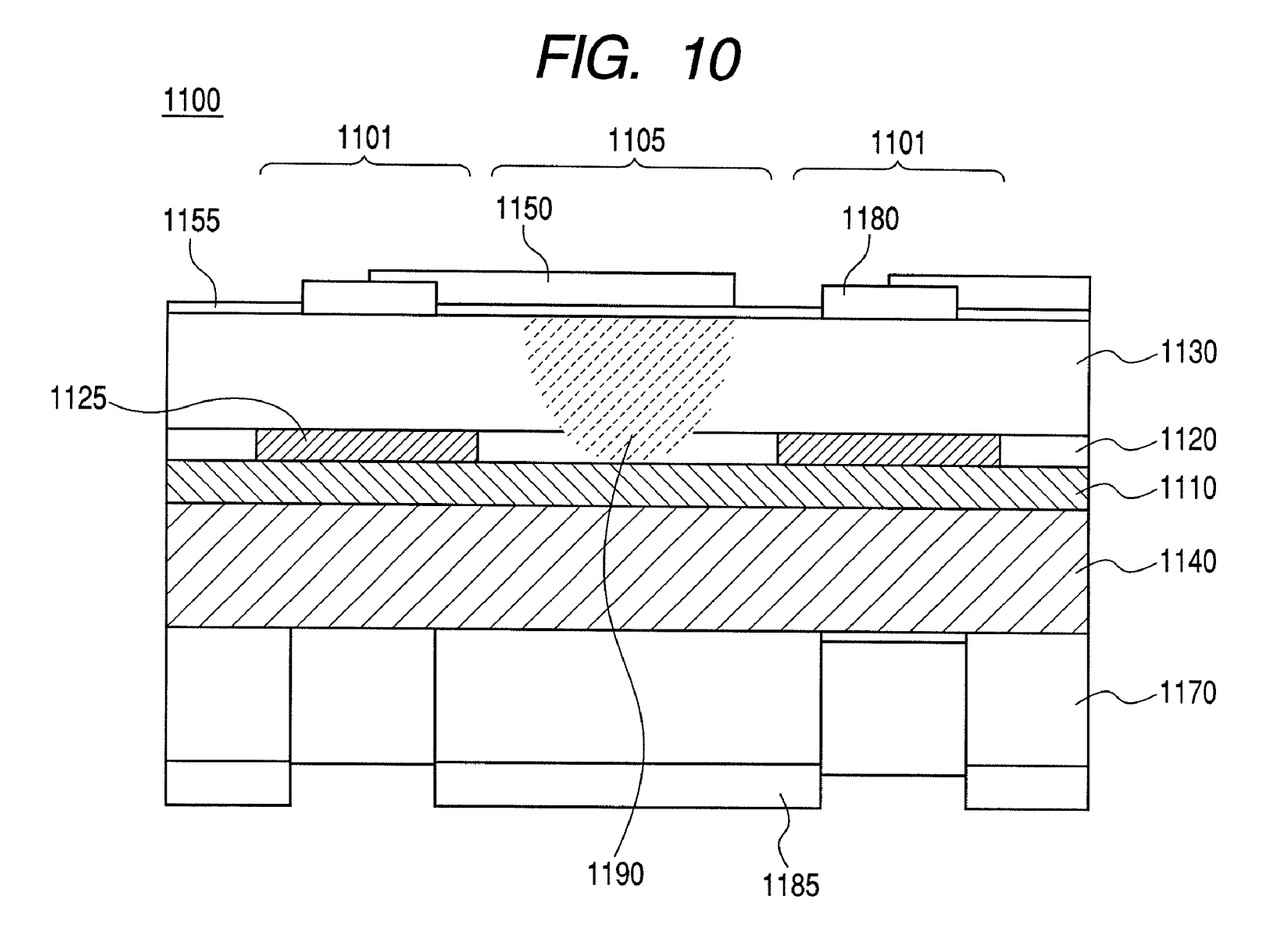
FIG. 10 is a schematic cross-sectional view illustrating a surface emitting laser array according to Example 3 of the present invention.

FIG. 10 is a schematic cross-sectional view illustrating the surface emitting laser array in the present example.

In FIG. 10, a surface emitting laser array 1100 includes a surface emitting laser 1101, a region 1105 between the respective surface emitting lasers, an active layer 1110, a slab layer 1120, photonic crystal structures 1125, a cladding layer 1130, and a multilayer mirror 1140. The surface emitting laser array 1100 further includes a light absorber 1150 that is an absorber of laser resonant light, a passivation film 1155, a substrate 1170, an upper electrode 1180, a lower electrode 1185, and an electrically insulated region 1190.

In the same way as in Example 1, the multilayer mirror 1140, the active layer 1110, the slab layer 1120, and the cladding layer 1130 are formed on the substrate 1170. In the slab layer, multiple photonic crystal structures 1125 are formed. Further, in the cladding layer and the slab layer between the respective surface emitting lasers, the electrically insulated region 1190 is provided.

Even in the case where laser light is not guided as it is from the active layer of the surface emitting laser that is oscillated by the optical resonator due to the photonic crystal and the multilayer mirror to the region between the surface emitting lasers through the active layer, laser light may be scattered at a border of the photonic crystal structure. In this case, stray light is generated, which may have an adverse effect on characteristics of the laser element and laser array.

In the surface emitting laser array 1100 in Example 3, the light absorber 1150 is provided in a part of the upper portion of the cladding layer located in the region 1105 between the surface emitting lasers. The light absorber is provided for the purpose of absorbing stray light present in the region 1105 between the respective surface emitting lasers.

An example of the light absorber 1150 includes metal. As the metal, for example, gold can be used in light with a wavelength of 670 nm.

The passivation film 1155 may be provided between the light absorber 1150 and the cladding layer 1130. The passivation film is made of, for example, $SiO_2$.

Further, the metal may be used as a part of the upper electrode 1180 or wiring to the upper electrode 1180.

Further, light of the surface emitting laser 1101 may be taken out from the substrate side. In this case, light is not taken out from the side opposite to the substrate, whereby the light absorber 1150 can be placed over substantially the entire upper surface of the cladding layer 1130.

In this case, in the lower electrode 1185 provided under the substrate, a portion corresponding to a light take-out portion of each surface emitting laser is removed.

Further, in the case where the substrate absorbs light at an oscillation wavelength of the surface light emitting laser, the substrate 1170 corresponding to the light take-out portion is removed by etching or the like, whereby the attenuation of an output caused by the light absorption in the substrate can be suppressed.

Although the examples have been described as above, the surface emitting laser array of the present invention is not limited to those examples.

In particular, the materials and shapes of the semiconductor layer, the photonic crystal, the semiconductor multilayer mirror, and the electrode, the lattice shape of the photonic crystal, and the like can be varied appropriately within the scope of the present invention.

Further, although a laser oscillation wavelength of 670 nm has been illustrated in the examples described above, the present invention is not limited thereto, and oscillation at any wavelength can be performed by selecting suitable materials and structures.

For example, an AlGaInN based material can be used in a wavelength band of 400 nm and an InGaAsP based material can be used in a wavelength band of 1 μm.

The refractive index periodical structure of the photonic crystal may be one-dimensional periodical structure or two-dimensional periodical structure.

The surface emitting laser array of the present invention described above can also be used as an array light source for performing drawing on a photosensitive drum of an image forming apparatus such as a copying machine and a laser printer.

This application claims the benefit of Japanese Patent Application No. 2008-054867 filed May 3, 2008, which is hereby incorporated by reference herein in its entirety.

The invention claimed is

1. A surface emitting laser array, comprising:
   at least two surface emitting lasers formed on a substrate, each having a laminated structure of multiple semiconductor layers including a semiconductor multilayer minor, an active layer, and a photonic crystal having a refractive index profile in an in-plane direction, the photonic crystal and the semiconductor multilayer minor in the laminated structure forming a waveguide for guiding light in a resonance mode;
   a region without the photonic crystal provided between adjacent surface emitting lasers in the surface emitting laser array; and
   an absorber of laser resonant light, provided between the at least two surface emitting lasers on a side opposite to the substrate when seen from the active layer of any of the at least two surface emitting lasers,
   wherein the adjacent surface emitting lasers have a same semiconductor multilayer mirror and a same active layer, and
   wherein the waveguide is an in-plane resonant waveguide.

2. A surface emitting laser array according to claim 1, wherein the semiconductor multilayer mirror has a higher reflectance with respect to light at an incident angle of more than 0° and less than 90°, compared with that with respect to light at an incident angle of 0°.

3. A surface emitting laser array according to claim 1, further comprising a unit for driving the surface emitting laser array by optical excitation of the active layer.

4. A surface emitting laser array according to claim 1, further comprising a unit for driving the surface emitting laser array by injection of carriers into the active layer.

5. A surface emitting laser array according to claim 1, wherein the at least two surface emitting lasers are insulated from each other electrically.

6. A surface emitting laser array according to claim 5, wherein the at least two surface emitting lasers that are insulated from each other electrically are insulated by a decrease in electrical conductivity by injection of ions into one of a part and a whole of a region between the at least two surface emitting lasers.

7. A surface emitting laser array according to claim 1, wherein each of the multiple semiconductor layers contains one of p-doped GaN, p-doped AlGaN, p-doped InGaN, and p-doped AlInGaN.

8. A surface emitting laser array according to claim 1, wherein the absorber is metal.

9. A surface emitting laser array according to claim 8, wherein the metal is one of wiring and a part of an electrode for driving each of the at least two surface emitting lasers electrically.

10. A surface emitting laser array according to claim 1, having an array pitch of 100 μm or less.

11. A surface emitting laser array, comprising:
   a first surface emitting laser which has a laminated structure of multiple semiconductor layers including a first semiconductor multilayer mirror, a first active layer, and a first photonic crystal having a refractive index profile in an in-plane direction, the first photonic crystal and the first semiconductor multilayer minor forming a waveguide for guiding light in a resonance mode;
   a second surface emitting laser which has a laminated structure of multiple semiconductor layers including the first semiconductor multilayer mirror, the first active layer, and a second photonic crystal that has a refractive index profile in an in-plane direction and is different from the first photonic crystal, the second photonic crystal and the first semiconductor multilayer mirror forming a waveguide for guiding light in the resonance mode; and
   an absorber of laser resonant light, provided between the first surface emitting laser and the second surface emitting laser on a side opposite to a substrate supporting the first surface emitting laser and the second surface emitting laser, when seen from the first active layer,
   wherein the waveguide of the first surface emitting laser and the waveguide of the second surface emitting laser are in-plane resonant waveguides.

* * * * *